United States Patent
Li et al.

(10) Patent No.: US 12,494,456 B2
(45) Date of Patent: Dec. 9, 2025

(54) SEMICONDUCTOR ASSEMBLY AND METHOD FOR MANUFACTURING THE SAME

(71) Applicant: UNITED MICROELECTRONICS CORP., Hsinchu (TW)

(72) Inventors: Kun-Ju Li, Tainan (TW); Hsin-Jung Liu, Pingtung County (TW); Zong-Sian Wu, Tainan (TW); Wei-Xin Gao, Tainan (TW); Jhih-Yuan Chen, Kaohsiung (TW); Ang Chan, Taipei (TW); Chau-Chung Hou, Tainan (TW); Hsiang-Chi Chien, Pingtung County (TW); I-Ming Lai, Kaohsiung (TW)

(73) Assignee: UNITED MICROELECTRONICS CORP, Hsinchu (TW)

( * ) Notice: Subject to any disclaimer, the term of this patent is extended or adjusted under 35 U.S.C. 154(b) by 590 days.

(21) Appl. No.: 17/940,021

(22) Filed: Sep. 8, 2022

(65) Prior Publication Data
US 2024/0055401 A1    Feb. 15, 2024

(30) Foreign Application Priority Data
Aug. 10, 2022   (TW) .................................. 111130044

(51) Int. Cl.
*H01L 25/065*    (2023.01)
*H01L 23/00*    (2006.01)
(Continued)

(52) U.S. Cl.
CPC .......... *H01L 25/0657* (2013.01); *H01L 24/05* (2013.01); *H01L 24/06* (2013.01); *H01L 24/08* (2013.01); *H01L 24/80* (2013.01); *H10D 84/0156* (2025.01); *H10D 84/0191* (2025.01); *H10D 84/038* (2025.01); *H01L 2224/05018* (2013.01); *H01L 2224/05073* (2013.01); *H01L 2224/05157* (2013.01);
(Continued)

(58) Field of Classification Search
CPC ............ H01L 25/0657; H10D 84/0156; H10D 84/0191; H10D 84/038
See application file for complete search history.

(56) References Cited

U.S. PATENT DOCUMENTS 8,482,132 B2   7/2013   Yang et al.
8,536,709 B1   9/2013   Hsu et al.
(Continued)

OTHER PUBLICATIONS

Office Action issued by Taiwan Intellectual Property Office on Aug. 29, 2025.

*Primary Examiner* — Trang Q Tran
(74) *Attorney, Agent, or Firm* — WPAT, PC

(57) ABSTRACT

A semiconductor assembly and a method for manufacturing the same are provided. The semiconductor assembly includes a first substrate, a first well in the first substrate and having a first doping type, a second substrate, a second well in the second substrate and having a second doping type, a first dielectric layer between the first substrate and the second substrate, and a second dielectric layer between the first substrate and the second substrate. The first doping type is different from the second doping type. The second dielectric layer is bonded to the first dielectric layer. The first well overlaps with the second well in a vertical direction.

9 Claims, 6 Drawing Sheets

(51) Int. Cl.
*H10D 84/01* (2025.01)
*H10D 84/03* (2025.01)

(52) U.S. Cl.
CPC ............... *H01L 2224/05166* (2013.01); *H01L 2224/05176* (2013.01); *H01L 2224/05181* (2013.01); *H01L 2224/05187* (2013.01); *H01L 2224/05541* (2013.01); *H01L 2224/05576* (2013.01); *H01L 2224/05624* (2013.01); *H01L 2224/05647* (2013.01); *H01L 2224/05687* (2013.01); *H01L 2224/0603* (2013.01); *H01L 2224/08145* (2013.01); *H01L 2224/80895* (2013.01); *H01L 2224/80896* (2013.01); *H01L 2225/06524* (2013.01); *H01L 2225/06527* (2013.01); *H01L 2225/06544* (2013.01)

(56) References Cited

U.S. PATENT DOCUMENTS

| | | |
|---|---|---|
| 8,754,504 B2 | 6/2014 | Hsu et al. |
| 8,772,136 B2 | 7/2014 | Wang et al. |
| 8,802,538 B1 | 8/2014 | Liu et al. |
| 9,224,696 B2 | 12/2015 | Li et al. |
| 9,640,509 B1 | 5/2017 | Yang |
| 9,704,841 B2 | 7/2017 | Kuo |
| 11,139,272 B2 | 10/2021 | Makala et al. |
| 2021/0036040 A1* | 2/2021 | Kobayashi ............ H10F 39/199 |

* cited by examiner

SEMICONDUCTOR ASSEMBLY AND METHOD FOR MANUFACTURING THE SAME

This application claims the benefit of Taiwan application Serial No. 111130044, filed Aug. 10, 2022, the subject matter of which is incorporated herein by reference.

BACKGROUND

Technical Field

The disclosure relates to a semiconductor assembly and a method for manufacturing the same, and more particularly to a three-dimensional semiconductor assembly and a method for manufacturing the same.

Description of the Related Art

Three-dimensional integrated circuits (3DICs) are important technologies for advanced semiconductor manufacturing processes to achieve smaller package sizes and more functional integration. 3DICs use bonding technology to stack multiple semiconductor chips. Such technology can effectively use space and increase the number of components that can be accommodated per unit area. However, there are still several important issues unaddressed in the development of 3DICs, among which, how to reduce the bonding failure risk is a big concern.

It is desirable to provide an improved semiconductor assembly with good bonding quality.

SUMMARY

The present disclosure relates to a semiconductor assembly and a method for manufacturing the same.

According to an embodiment of the present disclosure, a semiconductor assembly is provided. The semiconductor assembly includes a first substrate, a first well in the first substrate and having a first doping type, a second substrate, a second well in the second substrate and having a second doping type, a first dielectric layer between the first substrate and the second substrate, and a second dielectric layer between the first substrate and the second substrate. The first doping type is different from the second doping type. The second dielectric layer is bonded to the first dielectric layer. The first well overlaps with the second well in a vertical direction.

According to an embodiment of the present disclosure, a method for manufacturing a semiconductor assembly is provided. The method includes: providing a first substrate; forming a first well in the first substrate, wherein the first well has a first doping type; forming a first conductive via on the first substrate; providing a second substrate; forming a second well in the second substrate, wherein the second well has a second doping type different from the first doping type; forming a second conductive via on the second substrate; bonding the first conductive via to the second conductive via, wherein the first well overlaps with the second well in a longitudinal direction after the first conductive via is bonded to the second conductive via.

The above and other embodiments of the disclosure will become better understood with regard to the following detailed description of the non-limiting embodiment(s). The following description is made with reference to the accompanying drawings.

DETAILED DESCRIPTION

The illustrations may not be necessarily drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments. The illustration uses the same/similar symbols to indicate the same/similar elements.

Figure 1:
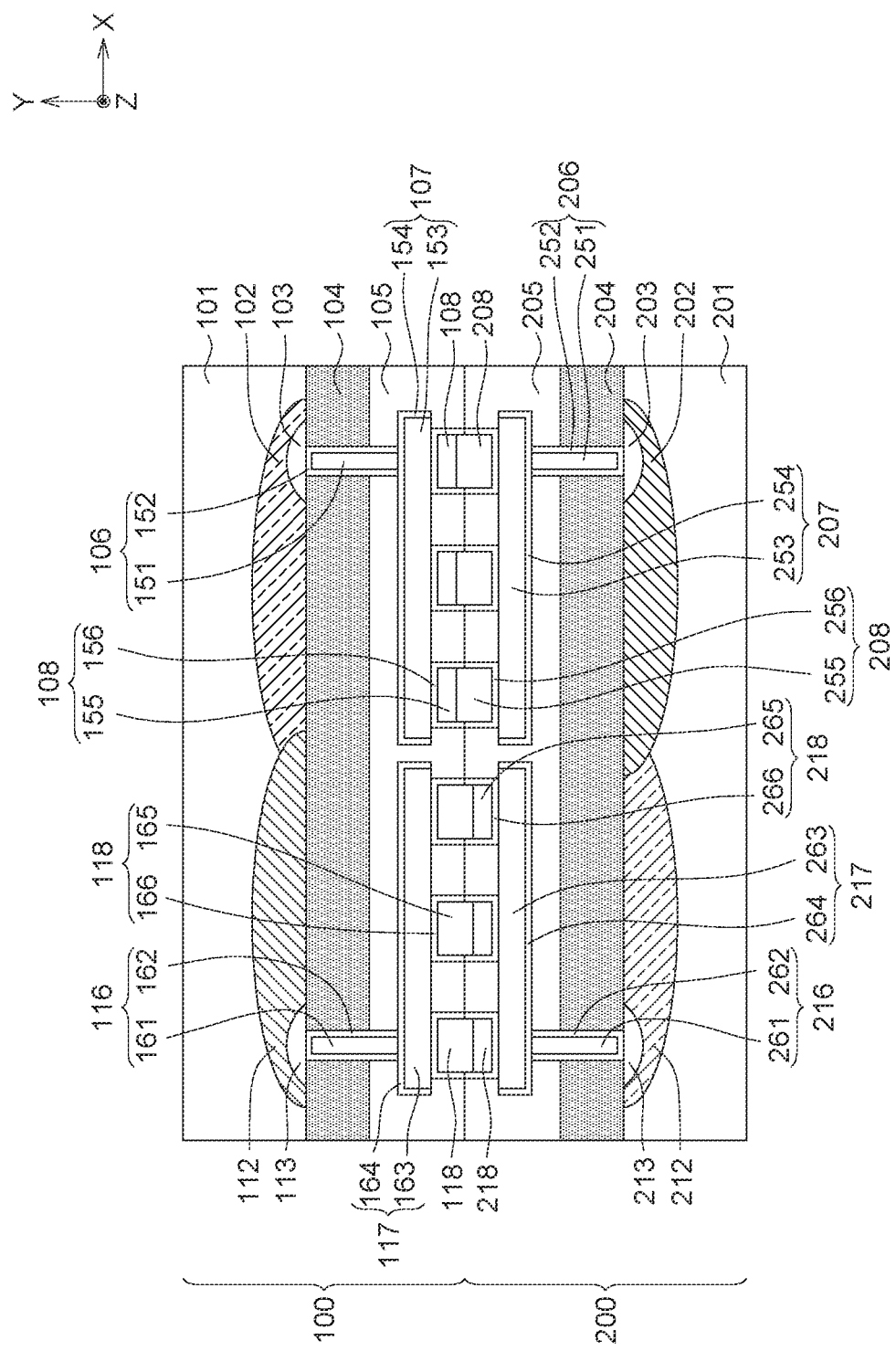
FIG. 1 schematically illustrates a cross-section view of a semiconductor assembly according to an embodiment of the present disclosure.

FIG. 1 schematically illustrates a cross-section view of a semiconductor assembly 10 according to an embodiment of the present disclosure. The semiconductor assembly 10 includes a semiconductor element 100 and a semiconductor element 200. The semiconductor element 100 can be stacked on the semiconductor element 200 in the Y direction, such as a longitudinal direction. The semiconductor element 100 includes a substrate 101, a well 102 in the substrate 101, a doping region 103 in the well 102, a device layer 104 on the substrate 101, a dielectric layer 105 on the device layer 104, a conductive region 107 in the dielectric layer 105, a via element 108 in the dielectric layer 105, and an interconnect structure 106 between the conductive region 107 and the substrate 101. The well 102 may have a first doping type. The doping region 103 may have a first doping type. A depth of the well 102 in the Y direction may be greater than that of the doping region 103 in the Y direction. The device layer 104 may be between the dielectric layer 105 and the substrate 101. For example, the device layer 104 may directly contact the well 102 and/or the doping region 103. The via element 108 and the interconnect structure 106 may be on opposite sides of the conductive region 107. The conductive region 107 is between the via element 108 and the substrate 101. The conductive region 107 may extend along the X direction, such as a lateral direction. In an embodiment, an area of the conductive region 107 in the X-Z plane is greater than that of the via element 108 in the X-Z plane. The interconnect structure 106 may extend through the dielectric layer 105 and the device layer 104 to the doping region 103 in the Y direction. A portion of the interconnect structure 106 may be in the dielectric layer 105. Another portion of the interconnect structure 106 may be in the device layer 104. The well 102, the doping region 103, the interconnect structure 106, the conductive region 107 and the via element 108 are electrically connected to each other.

The semiconductor element 100 may include a plurality of via elements 108. In this embodiment, the semiconductor element 100 includes three via elements 108 on the conductive region 107. The present disclosure is not limited thereto. The semiconductor element may include more than three via elements 108 or less than three via elements 108 on the conductive region 107. In this embodiment, the via elements 108 may correspond to the well 102. The via elements 108 may overlap with the well 102 in the Y direction. The via element 108 may include a conductive via 155 and a barrier layer 156. The barrier layer 156 may be on an outer surface of the conductive via 155. A portion of the barrier layer 156 may be between the conductive via 155 and the dielectric layer 105. Another portion of the barrier layer 156 may be between the conductive via 155 and the conductive region 107.

The conductive region 107 may overlap with the well 102 in the Y direction. The conductive region 107 may include a conductive layer 153 and a barrier layer 154. The barrier layer 154 may be on an outer surface of the conductive layer 153. A portion of the barrier layer 154 may be between the conductive layer 153 and the dielectric layer 105. Another portion of the barrier layer 154 may be between the conductive layer 153 and the interconnect structure 106.

The interconnect structure 106 may include an interconnect element 151 and a barrier layer 152. The barrier layer 152 may be on an outer surface of the interconnect element 151. A portion of the barrier layer 152 may be between the interconnect element 151 and the dielectric layer 105; another portion of the barrier layer 152 may be between the interconnect element 151 and the device layer 104; still another portion of the barrier layer 152 may be between the interconnect element 151 and the doping region 103.

The semiconductor element 100 may further include a well 112 in the substrate 101, a doping region 113 in the well 112, a conductive region 117 in the dielectric layer 105, a via element 118 in the dielectric layer 105, and an interconnect structure 116 between the conductive region 117 and the substrate 101. The well 112 may have a second doping type. A depth of the well 112 in the Y direction may be greater than that of the doping region 113 in the Y direction. The doping region 113 may have a second doping type. The device layer 104 may directly contact the well 112 and/or the doping region 113. The via element 118 and the interconnect structure 116 may be on opposite sides of the conductive region 117. The conductive region 117 is between the via element 118 and the substrate 101. The conductive region 117 may extend along the X direction. In an embodiment, an area of the conductive region 117 in the X-Z plane is greater than that of the via element 118 in the X-Z plane. The interconnect structure 116 may extend through the dielectric layer 105 and the device layer 104 to the doping region 113 in the Y direction. A portion of the interconnect structure 116 may be in the dielectric layer 105. Another portion of the interconnect structure 116 may be in the device layer 104. The well 112, the doping region 113, the interconnect structure 116, the conductive region 117 and the via element 118 are electrically connected to each other.

The well 112 may adjoin the well 102 (i.e. the well 112 may be adjacent to and contacting the well 102). The conductive region 117 and the conductive region 107 are non-overlapping in the Y direction.

The semiconductor element 100 may include a plurality of via elements 118. In this embodiment, the semiconductor element 100 includes three via elements 118 on the conductive region 117. The present disclosure is not limited thereto. The semiconductor element may include more than three via elements 118 or less than three via elements 118 on the conductive region 117. In this embodiment, the via elements 118 may correspond to the well 112. The via elements 118 may overlap with the well 112 in the Y direction. The via element 118 may include a conductive via 165 and a barrier layer 166. The barrier layer 166 may be on an outer surface of the conductive via 165. A portion of the barrier layer 166 may be between the conductive via 165 and the dielectric layer 105. Another portion of the barrier layer 166 may be between the conductive via 165 and the conductive region 117.

The conductive region 117 may overlap with the well 112 in the Y direction. The conductive region 117 may include a conductive layer 163 and a barrier layer 164. The barrier layer 164 may be on an outer surface of the conductive layer 163. A portion of the barrier layer 164 may be between the conductive layer 163 and the dielectric layer 105. Another portion of the barrier layer 164 may be between the conductive layer 163 and the interconnect structure 116.

The interconnect structure 116 may include an interconnect element 161 and a barrier layer 162. The barrier layer 162 may be on an outer surface of the interconnect element 161. A portion of the barrier layer 162 may be between the interconnect element 161 and the dielectric layer 105; another portion of the barrier layer 162 may be between the interconnect element 161 and the device layer 104; still another portion of the barrier layer 162 may be between the interconnect element 161 and the doping region 113.

The semiconductor element 200 includes a substrate 201, a well 202 in the substrate 201, a doping region 203 in the well 202, a device layer 204 on the substrate 201, a dielectric layer 205 on the device layer 204, a conductive region 207 in the dielectric layer 205, a via element 208 in the dielectric layer 205, and an interconnect structure 206 between the conductive region 207 and the substrate 201. The well 202 may have a second doping type. The doping region 203 may have a second doping type. A depth of the well 202 in the Y direction may be greater than that of the doping region 203 in the Y direction. The device layer 204 may be between the dielectric layer 205 and the substrate 201. For example, the device layer 204 may directly contact the well 202 and/or the doping region 203. The via element 208 and the interconnect structure 206 may be on opposite sides of the conductive region 207. The conductive region 207 is between the via element 208 and the substrate 201. The conductive region 207 may extend along the X direction. In an embodiment, an area of the conductive region 207 in the X-Z plane is greater than that of the via element 208 in the X-Z plane. The interconnect structure 206 may extend through the dielectric layer 205 and the device layer 204 to the doping region 203 in the Y direction. A portion of the interconnect structure 206 may be in the dielectric layer 205. Another portion of the interconnect structure 206 may be in the device layer 204. The well 202, the doping region 203, the interconnect structure 206, the conductive region 207 and the via element 208 are electrically connected to each other.

The semiconductor element 100 may include a plurality of via elements 208. In this embodiment, the semiconductor element 200 includes three via elements 208 on the conductive region 207. The present disclosure is not limited thereto. The semiconductor element may include more than three via elements 208 or less than three via elements 208 on the conductive region 207. In this embodiment, the via elements 208 may correspond to the well 202. The via elements 208 may overlap with the well 202 in the Y direction. The via element 208 may include a conductive via 255 and a barrier layer 256. The barrier layer 256 may be on an outer surface of the conductive via 255. A portion of the barrier layer 256 may be between the conductive via 255 and the dielectric layer 205. Another portion of the barrier layer 256 may be between the conductive via 255 and the conductive region 207.

The conductive region 207 may overlap with the well 202 in the Y direction. The conductive region 207 may include a conductive layer 253 and a barrier layer 254. The barrier layer 254 may be on an outer surface of the conductive layer 253. A portion of the barrier layer 254 may be between the conductive layer 253 and the dielectric layer 205. Another portion of the barrier layer 254 may be between the conductive layer 253 and the interconnect structure 206.

The interconnect structure 206 may include an interconnect element 251 and a barrier layer 252. The barrier layer 252 may be on an outer surface of the interconnect element 251. A portion of the barrier layer 252 may be between the interconnect element 251 and the dielectric layer 205; another portion of the barrier layer 252 may be between the interconnect element 251 and the device layer 204; still another portion of the barrier layer 252 may be between the interconnect element 251 and the doping region 203.

The semiconductor element 200 may further include a well 212 in the substrate 201, a doping region 213 in the well 212, a conductive region 217 in the dielectric layer 205, a via element 218 in the dielectric layer 205, and an interconnect structure 216 between the conductive region 217 and the substrate 201. The well 212 may have a first doping type. The doping region 213 may have a first doping type. A depth of the well 212 in the Y direction may be greater than that of the doping region 213 in the Y direction. The device layer 204 may directly contact the well 212 and/or the doping region 213. The via element 218 and the interconnect structure 216 may be on opposite sides of the conductive region 217. The conductive region 217 is between the via element 218 and the substrate 201. The conductive region 217 may extend along the X direction. In an embodiment, an area of the conductive region 217 in the X-Z plane is greater than that of the via element 218 in the X-Z plane. The interconnect structure 216 may extend through the dielectric layer 205 and the device layer 204 to the doping region 213 in the Y direction. A portion of the interconnect structure 216 may be in the dielectric layer 205. Another portion of the interconnect structure 216 may be in the device layer 204. The well 212, the doping region 213, the interconnect structure 216, the conductive region 217 and the via element 218 are electrically connected to each other.

The well 212 may adjoin the well 202 (i.e. the well 212 may be adjacent to and contacting the well 202). The conductive region 217 and the conductive region 207 are non-overlapping in the Y direction.

The semiconductor element 200 may include a plurality of via elements 218. In this embodiment, the semiconductor element 200 includes three via elements 218 on the conductive region 217. The present disclosure is not limited thereto. The semiconductor element may include more than three via elements 218 or less than three via elements 218 on the conductive region 217. In this embodiment, the via elements 218 may correspond to the well 212. The via elements 218 may overlap with the well 212 in the Y direction. The via element 218 may include a conductive via 265 and a barrier layer 266. The barrier layer 266 may be on an outer surface of the conductive via 265. A portion of the barrier layer 266 may be between the conductive via 265 and the dielectric layer 205. Another portion of the barrier layer 266 may be between the conductive via 265 and the conductive region 217.

The conductive region 217 may overlap with the well 212 in the Y direction. The conductive region 217 may include a conductive layer 263 and a barrier layer 264. The barrier layer 264 may be on an outer surface of the conductive layer 263. A portion of the barrier layer 264 may be between the conductive layer 263 and the dielectric layer 205. Another portion of the barrier layer 264 may be between the conductive layer 263 and the interconnect structure 216.

The interconnect structure 216 may include an interconnect element 261 and a barrier layer 262. The barrier layer 262 may be on an outer surface of the interconnect element 261. A portion of the barrier layer 262 may be between the interconnect element 261 and the dielectric layer 205; another portion of the barrier layer 262 may be between the interconnect element 261 and the device layer 204; still another portion of the barrier layer 262 may be between the interconnect element 261 and the doping region 213.

The first doping type is different from the second doping type. In this embodiment, the first doping type may be n-type, and the second doping type may be p-type. The doping region 103 may have a doping concentration (n+) higher than the doping concentration of the well 102. The doping region 113 may have a doping concentration (p+) higher than the doping concentration of the well 112. The doping region 203 may have a doping concentration (p+) higher than the doping concentration of the well 202. The doping region 213 may have a doping concentration (n+) higher than the doping concentration of the well 212. A p-n junction is formed between the well 102 and the well 112. A p-n junction is formed between the well 202 and the well 212.

The semiconductor element 100 is bonded to the semiconductor element 200. The bonding of the semiconductor element 100 and the semiconductor element 200 may include making the well 102 of the semiconductor 100 correspond to the well 202 of the semiconductor element 200, and/or making the well 112 of the semiconductor element 100 correspond to the well 212 of the semiconductor element 200. For example, the dielectric layer 105 of the semiconductor element 100 may be bonded to the dielectric layer 205 of the semiconductor element 200. The via element 108 of the semiconductor element 100 may be bonded and electrically connected to the via element 208 of the semiconductor element 200. The well 102 may overlap with the well 202 in the Y direction. The well 112 may overlap with the well 212 in the Y direction. The well 102, the well 202, the via element 118 and the via element 218 are electrically connected to each other.

In this embodiment, the bonding of the semiconductor element 100 and the semiconductor element 200 includes a hybrid bonding. That is, the bonding of the semiconductor element 100 and the semiconductor element 200 involves at least two types of bonding, such as metal-to-metal bonding and nonmetal-to-nonmetal bonding.

FIGS. 2A-2I schematically illustrate a method for manufacturing a semiconductor assembly according to an embodiment of the present disclosure. The method for manufacturing a semiconductor assembly includes forming at least two semiconductor elements respectively. FIGS. 2A-2D shows the manufacturing steps for manufacturing one semiconductor element, and FIGS. 2E-2H shows the manufacturing steps for manufacturing another one semiconductor element. Semiconductor elements can be formed simultaneously or sequentially, and the manufacturing steps for the semiconductor element are not limited to the order in the drawings.

Figure 2A:
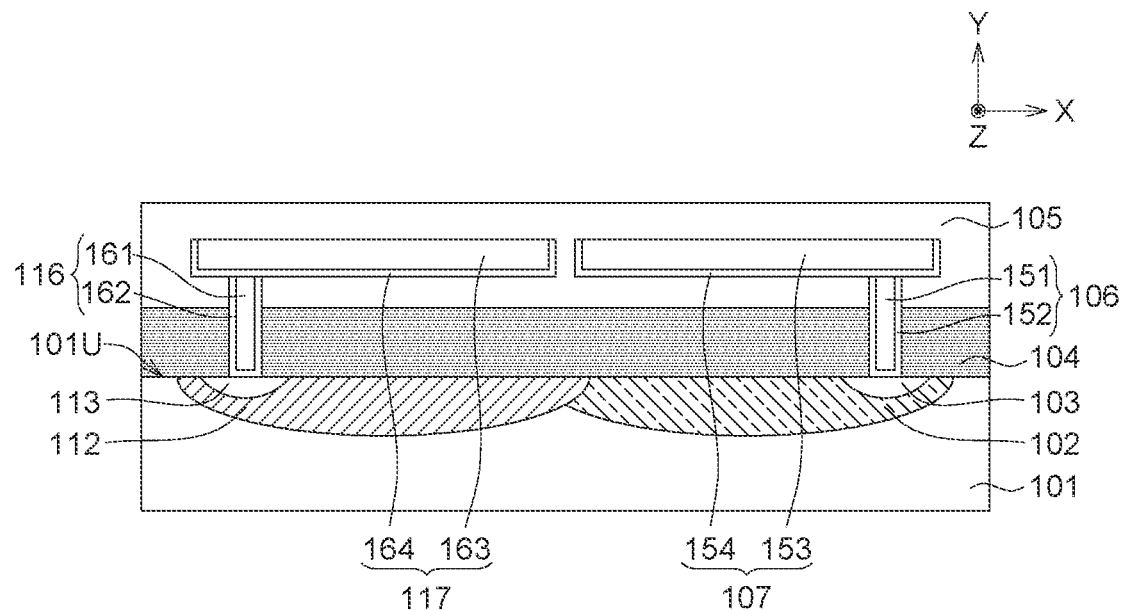
FIGS. 2A-2I schematically illustrate a method for manufacturing a semiconductor assembly according to an embodiment of the present disclosure.

Referring to FIG. 2A, a substrate 101 is provided. The substrate 101 may be a semiconductor substrate, such as a silicon (Si) substrate, or may be a SOI (silicon on insulator) substrate. In an embodiment, the substrate 101 may include multilayer structure. The well 102 having a first doping type and the well 112 having a second doping type are formed in the substrate 101. The well 102 may adjoin the well 112. The doping region 103 having the first doping type is formed in the well 102. The doping region 113 having the second doping type is formed in the well 112. In an embodiment, dopants with predetermined amount and type are introduced into the substrate 101 by an ion implantation method to form the well 102, the doping region 103, the well 112 and the doping region 113.

The device layer 104 and the dielectric layer 105 are formed on an upper surface 101U of the substrate 101. The device layer 104 may include at least one semiconductor device, such as a transistor, capacitor, resistor, other active/passive semiconductor device, microelectronic/micromechanical structures, or any combination thereof. The dielectric layer 105 may include a dielectric material, such as silicon oxide ($SiO_x$), silicon nitride ($SiN_x$), silicon carbonitride ($SiC_x N_y$), etc. The conductive region 107 and the conductive region 117 are formed in the dielectric layer 105. The conductive region 107 may be formed apart from the conductive region 117 in the dielectric layer 105. For example, the conductive region 107 includes a barrier layer 154 and a conductive layer 153 on the barrier layer 154. For example, the conductive region 117 includes a barrier layer 164 and a conductive layer 163 on the barrier layer 164. The barrier layer 154 and the barrier layer 164 may include metal barrier materials, such as tantalum (Ta), tantalum nitride (TaN), cobalt (Co), ruthenium (Ru), titanium (Ti), titanium nitride (TiN), etc. The barrier layer 154 and the barrier layer 164 may include the same material or different materials. The conductive layer 153 and the conductive layer 163 may include conductive materials, such as copper (Cu), aluminum (Al), etc. The conductive layer 153 and the conductive layer 163 may include the same material or different materials.

The interconnect structure 106 is formed between the conductive region 107 and doping region 103 and extending through the dielectric layer 105 and the device layer 104. The interconnect structure 116 is formed between the conductive region 117 and doping region 113 and extending through the dielectric layer 105 and the device layer 104. The interconnect structure 106 may be formed apart from the interconnect structure 116. For example, the interconnect structure 106 may include a barrier layer 152 and an interconnect element 151 on the barrier layer 152. For example, the interconnect structure 116 may include a barrier layer 162 and an interconnect element 161 on the barrier layer 162. The barrier layer 152 and barrier layer 162 may include metal barrier materials, such as tantalum (Ta), tantalum nitride (TaN), cobalt (Co), ruthenium (Ru), titanium (Ti), titanium nitride (TiN), etc. The barrier layer 152 and the barrier layer 162 may include the same material or different materials. The interconnect element 151 and the interconnect element 161 may include conductive materials, such as copper (Cu), aluminum (Al), etc. The interconnect element 151 and the interconnect element 161 may include the same material or different materials.

Figure 2B:
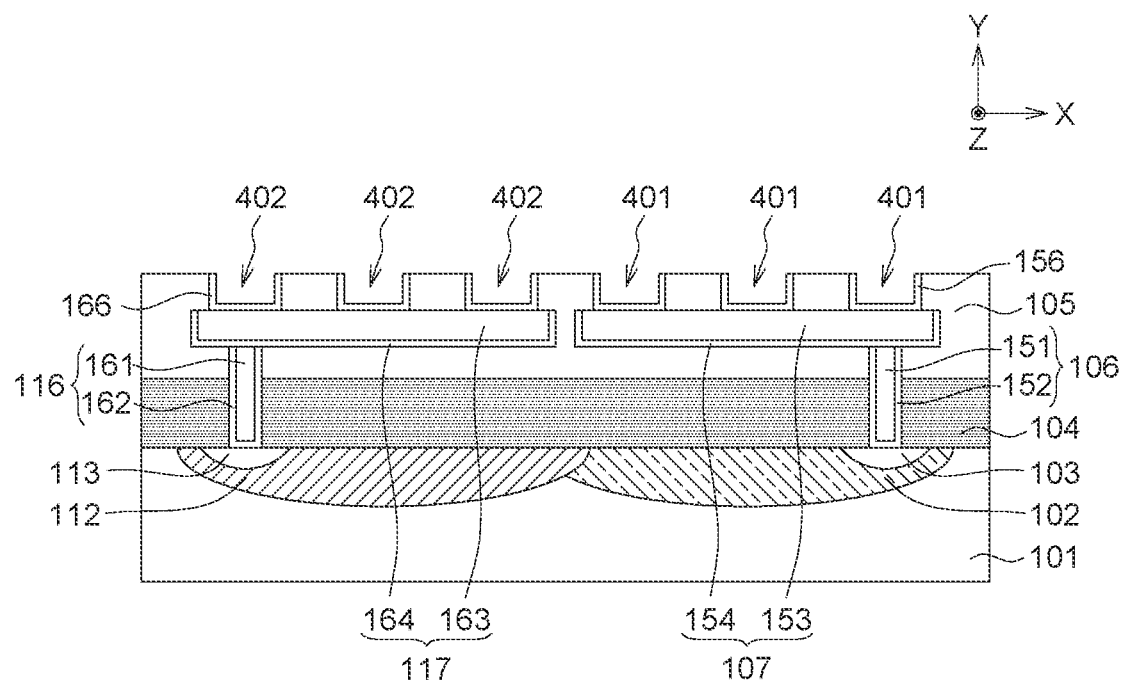

Referring to FIG. 2B, openings 401 and openings 402 are formed in the dielectric layer 105. The openings 401 may overlap with the well 102 in the Y direction. The openings 402 may overlap with the well 112 in the Y direction. In an embodiment, a portion of the dielectric layer 105 is removed by an etching process, such as a wet etching process or a dry etching process, to form the openings 401 and the openings 402. The barrier layer 156 is formed in the openings 401. The barrier layer 166 is formed in the openings 402. In an embodiment, the barrier layer 156 and the barrier layer 166 line the openings 401 and the openings 402 respectively by a deposition process, such as a chemical vapor deposition (CVD) process. The barrier layer 156 and the barrier layer 166 may include metal barrier materials, such as tantalum (Ta), tantalum nitride (TaN), cobalt (Co), ruthenium (Ru), titanium (Ti), titanium nitride (TiN), etc. The barrier layer 156 and the barrier layer 166 may include the same material or different materials.

Figure 2C:
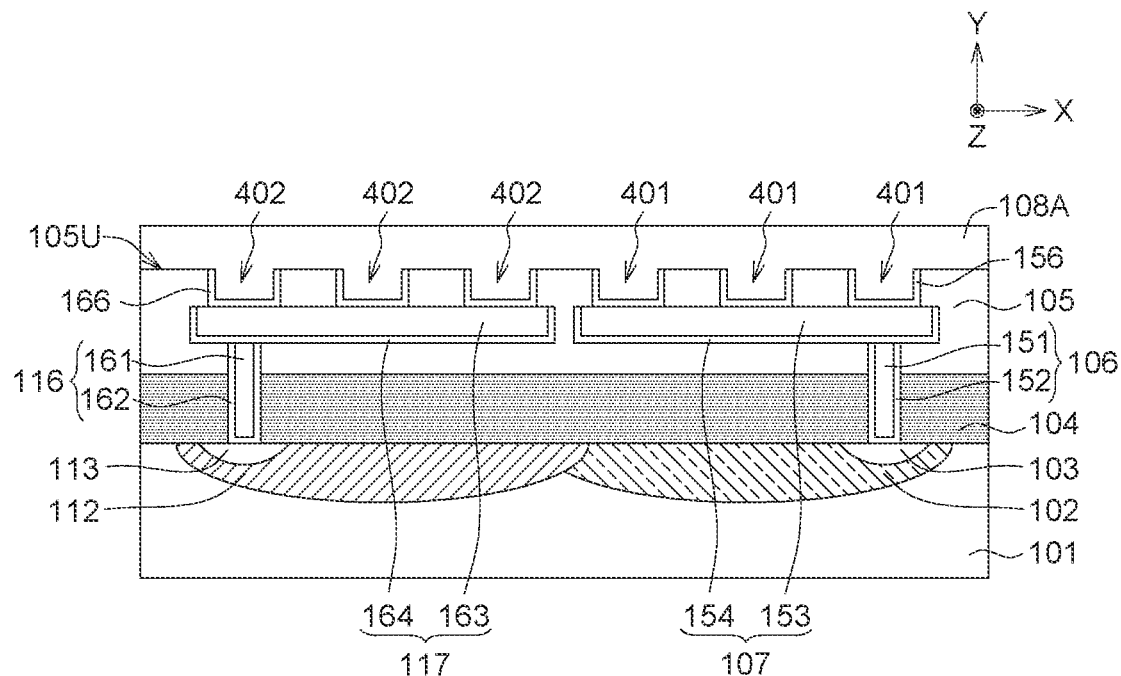

Referring to FIG. 2C, a conductive material layer 108A is formed in the openings 401 and the openings 402, and on an upper surface 105U of the dielectric layer 105. The conductive material layer 108A may be formed on the barrier layer 156 and the barrier layer 166. In an embodiment, the conductive material layer 108A is formed by a deposition process, such as a chemical vapor deposition process. The conductive material layer 108A may include a conductive material, such as copper (Cu), aluminum (Al), etc.

Figure 2D:
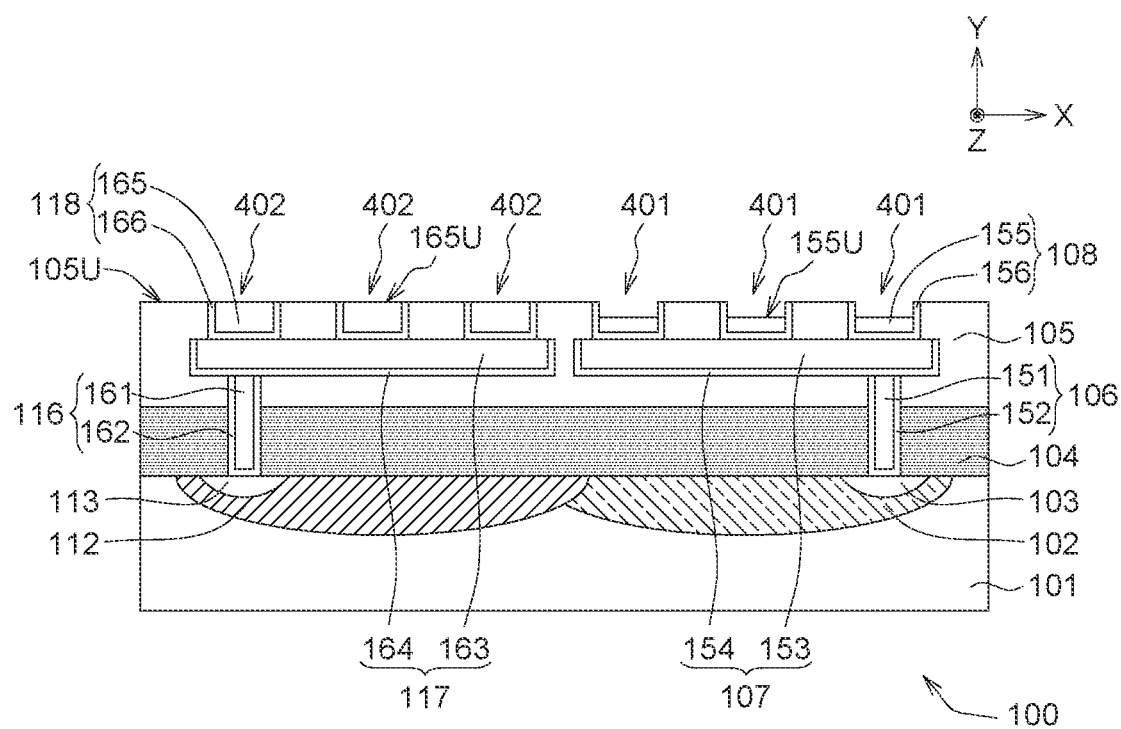

Referring to FIG. 2D, a portion of the conductive material layer 108A is removed to form conductive vias 155 in the openings 401 and conductive vias 165 in the openings 402, and expose the upper surface 105U of the dielectric layer 105. The via elements 108 and the via elements 118 are formed. The conductive via 155 may be formed on the barrier layer 156. The conductive via 165 may be formed on the barrier layer 166. In an embodiment, a portion of the conductive material layer 108A on the upper surface 105U of the dielectric layer 105 is removed by a chemical-mechanical planarization (CMP) process or other suitable etching processes, and portions of the conductive material layer 108A in the openings 401 and the openings 402 are remained. The portions of the conductive material layer 108A in the openings 401 are conductive vias 155. The portions of the conductive material layer 108A in the openings 402 are conductive vias 165. The conductive via 155 and the conductive via 165 may include conductive materials, such as copper (Cu), aluminum (Al), etc. In this step, an upper surface 155U of the conductive via 155 may be lower than the upper surface 105U of the dielectric layer 105. An upper surface 165U of the conductive via 165 may be coplanar with the upper surface 105U of the dielectric layer 105. The upper surface 165U of the conductive via 165 may be higher than the upper surface 155U of the conductive via 155. The via element 108 is electrically connected to the well 102 in the substrate 101 through the conductive region 107 and the interconnect structure 106. The via element 118 is electrically connected to the well 112 in the substrate 101 through the conductive region 117 and the interconnect structure 116.

In an embodiment, a semiconductor element 100 may be provided through the method schematically illustrated in FIGS. 2A-2D.

Figure 2E:
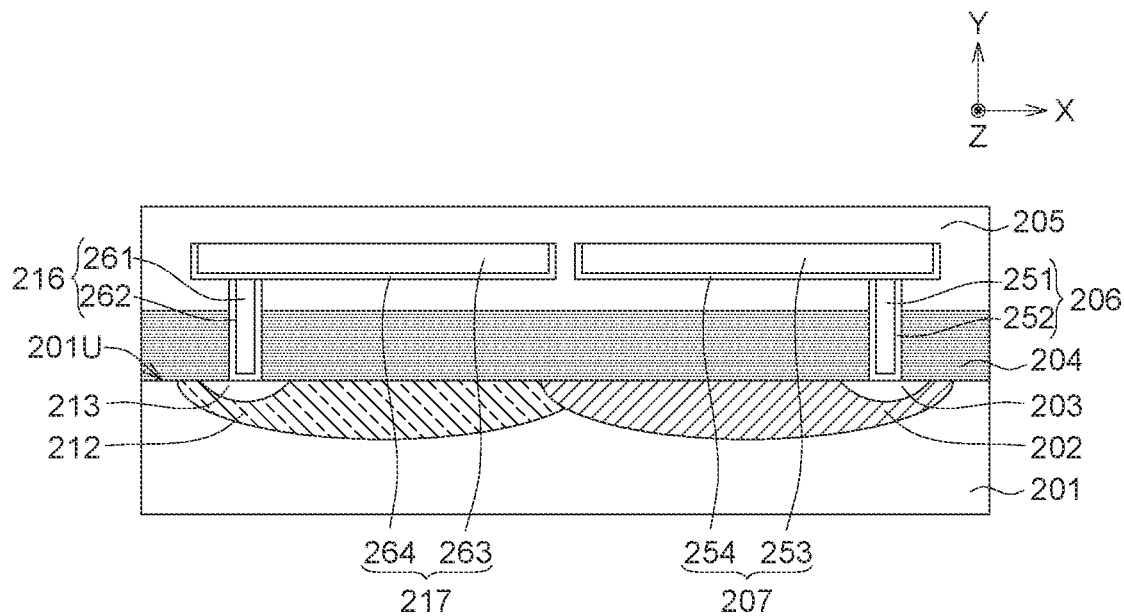

Referring to FIG. 2E, a substrate 201 is provided. The substrate 201 may be a semiconductor substrate, such as a silicon (Si) substrate, or may be a SOI (silicon on insulator) substrate. In an embodiment, the substrate 201 may include multilayer structure. The well 202 having the second doping type and the well 212 having the first doping type are formed in the substrate 201. The well 202 may adjoin the well 212. The doping region 203 having the second doping type is formed in the well 202. The doping region 213 having the first doping type is formed in the well 212. In an embodiment, dopants with predetermined amount and type are introduced into the substrate 201 by an ion implantation method to form the well 202, the doping region 203, the well 212 and the doping region 213.

The device layer 204 and the dielectric layer 205 are formed on an upper surface 201U of the substrate 201. The device layer 204 may include at least one semiconductor device, such as a transistor, capacitor, resistor, other active/ passive semiconductor device, microelectronic/micromechanical structures, or any combination thereof. The dielectric layer 205 may include a dielectric material, such as silicon oxide ($SiO_x$), silicon nitride ($SiN_x$), silicon carbonitride ($SiC_xN_y$), etc. The conductive region 207 and the conductive region 217 are formed in the dielectric layer 205. The conductive region 207 may be formed apart from the conductive region 217 in the dielectric layer 205. For example, the conductive region 207 includes a barrier layer 254 and a conductive layer 253 on the barrier layer 254. For example, the conductive region 217 includes a barrier layer 264 and a conductive layer 263 on the barrier layer 264. The barrier layer 254 and the barrier layer 264 may include metal barrier materials, such as tantalum (Ta), tantalum nitride (TaN), cobalt (Co), ruthenium (Ru), titanium (Ti), titanium nitride (TiN), etc. The barrier layer 254 and the barrier layer 264 may include the same material or different materials. The conductive layer 253 and the conductive layer 263 may include conductive materials, such as copper (Cu), aluminum (Al), etc. The conductive layer 253 and the conductive layer 263 may include the same material or different materials.

The interconnect structure 206 is formed between the conductive region 207 and doping region 203 and extending through the dielectric layer 205 and the device layer 204. The interconnect structure 216 is formed between the conductive region 217 and doping region 213 and extending through the dielectric layer 125 and the device layer 204. The interconnect structure 206 may be formed apart from the interconnect structure 216. For example, the interconnect structure 206 may include a barrier layer 252 and an interconnect element 251 on the barrier layer 252. For example, the interconnect structure 216 may include a barrier layer 262 and an interconnect element 261 on the barrier layer 262. The barrier layer 252 and barrier layer 262 may include metal barrier materials, such as tantalum (Ta), tantalum nitride (TaN), cobalt (Co), ruthenium (Ru), titanium (Ti), titanium nitride (TiN), etc. The barrier layer 252 and the barrier layer 262 may include the same material or different materials. The interconnect element 251 and the interconnect element 261 may include conductive materials, such as copper (Cu), aluminum (Al), etc. The interconnect element 251 and the interconnect element 261 may include the same material or different materials.

Figure 2F:
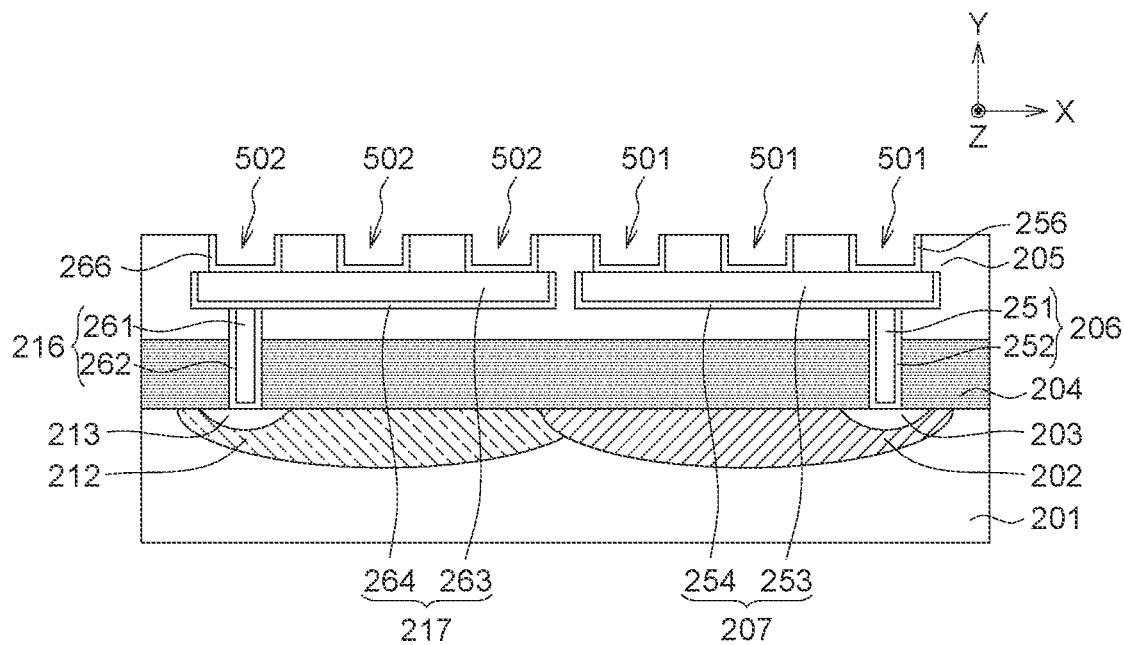

Referring to FIG. 2F, openings 501 and openings 502 are formed in the dielectric layer 205. The openings 501 may overlap with the well 202 in the Y direction. The openings 502 may overlap with the well 212 in the Y direction. In an embodiment, a portion of the dielectric layer 205 is removed by an etching process, such as a wet etching process or a dry etching process, to form the openings 501 and the openings 502. The barrier layer 256 is formed in the openings 501. The barrier layer 266 is formed in the openings 502. In an embodiment, the barrier layer 256 and the barrier layer 266 line the openings 501 and the openings 502 respectively by a deposition process, such as a chemical vapor deposition process. The barrier layer 256 and the barrier layer 266 may include metal barrier materials, such as tantalum (Ta), tantalum nitride (TaN), cobalt (Co), ruthenium (Ru), titanium (Ti), titanium nitride (TiN), etc. The barrier layer 256 and the barrier layer 266 may include the same material or different materials.

Figure 2G:
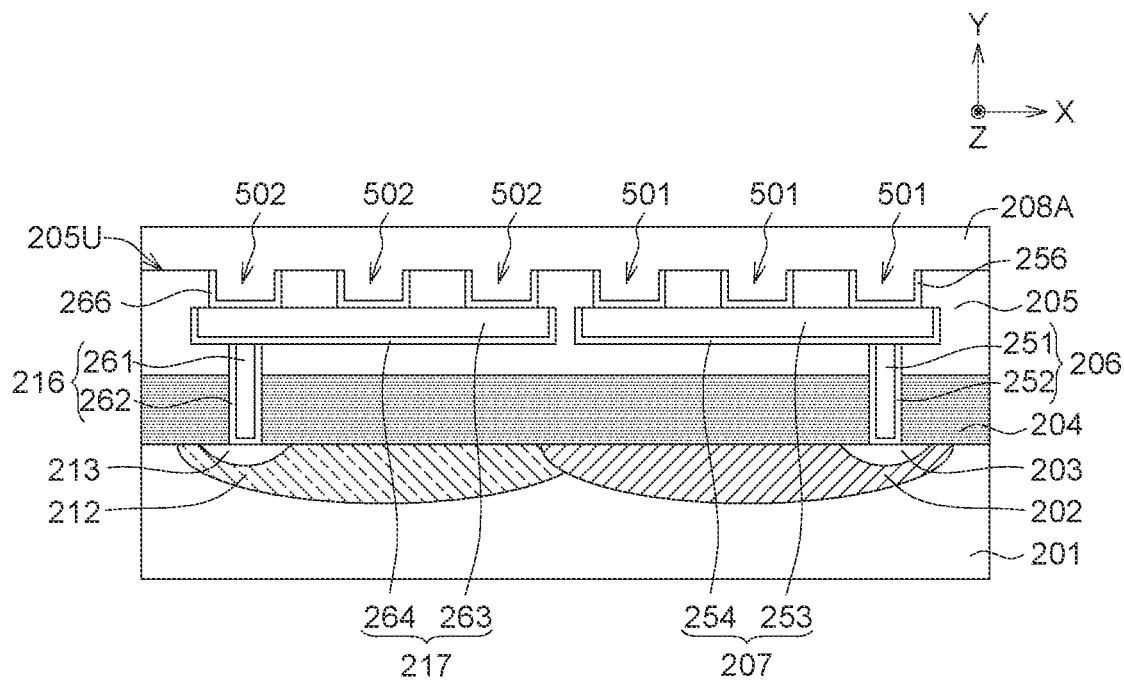

Referring to FIG. 2G, a conductive material layer 208A is formed in the openings 501 and the openings 502, and on an upper surface 205U of the dielectric layer 205. The conductive material layer 208A may be formed on the barrier layer 256 and the barrier layer 266. In an embodiment, the conductive material layer 208A is formed by a deposition process, such as a chemical vapor deposition process. The conductive material layer 208A may include a conductive material, such as copper (Cu), aluminum (Al), etc.

Figure 2H:
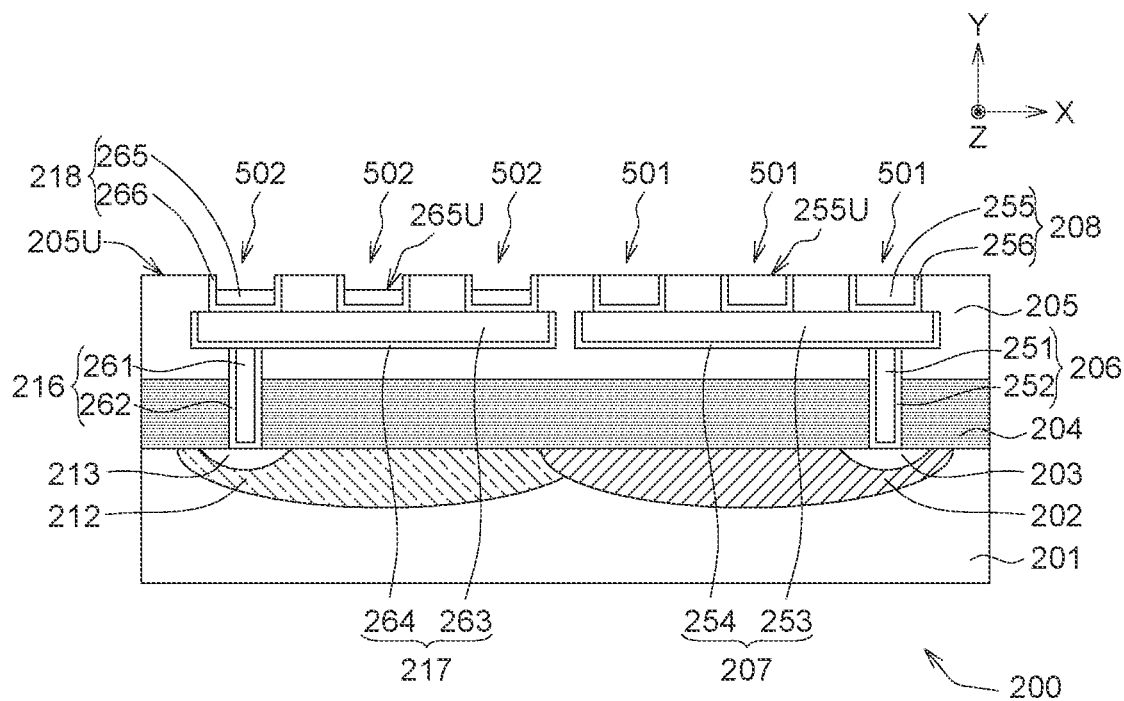

Referring to FIG. 2H, a portion of the conductive material layer 208A is removed to form conductive vias 255 in the openings 501 and conductive vias 265 in the openings 502, and expose the upper surface 205U of the dielectric layer 205. The via elements 208 and the via elements 218 are formed. The conductive via 255 may be formed on the barrier layer 256. The conductive via 265 may be formed on the barrier layer 266. In an embodiment, a portion of the conductive material layer 208A on the upper surface 205U of the dielectric layer 205 is removed by a chemical-mechanical planarization process or other suitable etching processes, and portions of the conductive material layer 208A in the openings 501 and the openings 502 are remained. The portions of the conductive material layer 208A in the openings 501 are conductive vias 255. The portions of the conductive material layer 208A in the openings 502 are conductive vias 265. The conductive via 255 and the conductive via 265 may include conductive materials, such as copper (Cu), aluminum (Al), etc. In this step, an upper surface 255U of the conductive via 255 may be coplanar with the upper surface 205U of the dielectric layer 205. An upper surface 265U of the conductive via 265 may be lower than the upper surface 205U of the dielectric layer 205. The upper surface 255U of the conductive via 255 may be higher than the upper surface 265U of the conductive via 265. The via element 208 is electrically connected to the well 202 in the substrate 201 through the conductive region 207 and the interconnect structure 206. The via element 218 is electrically connected to the well 212 in the substrate 201 through the conductive region 217 and the interconnect structure 216.

In an embodiment, a semiconductor element 200 may be provided through the method schematically illustrated in FIGS. 2E-2H.

Figure 2I:
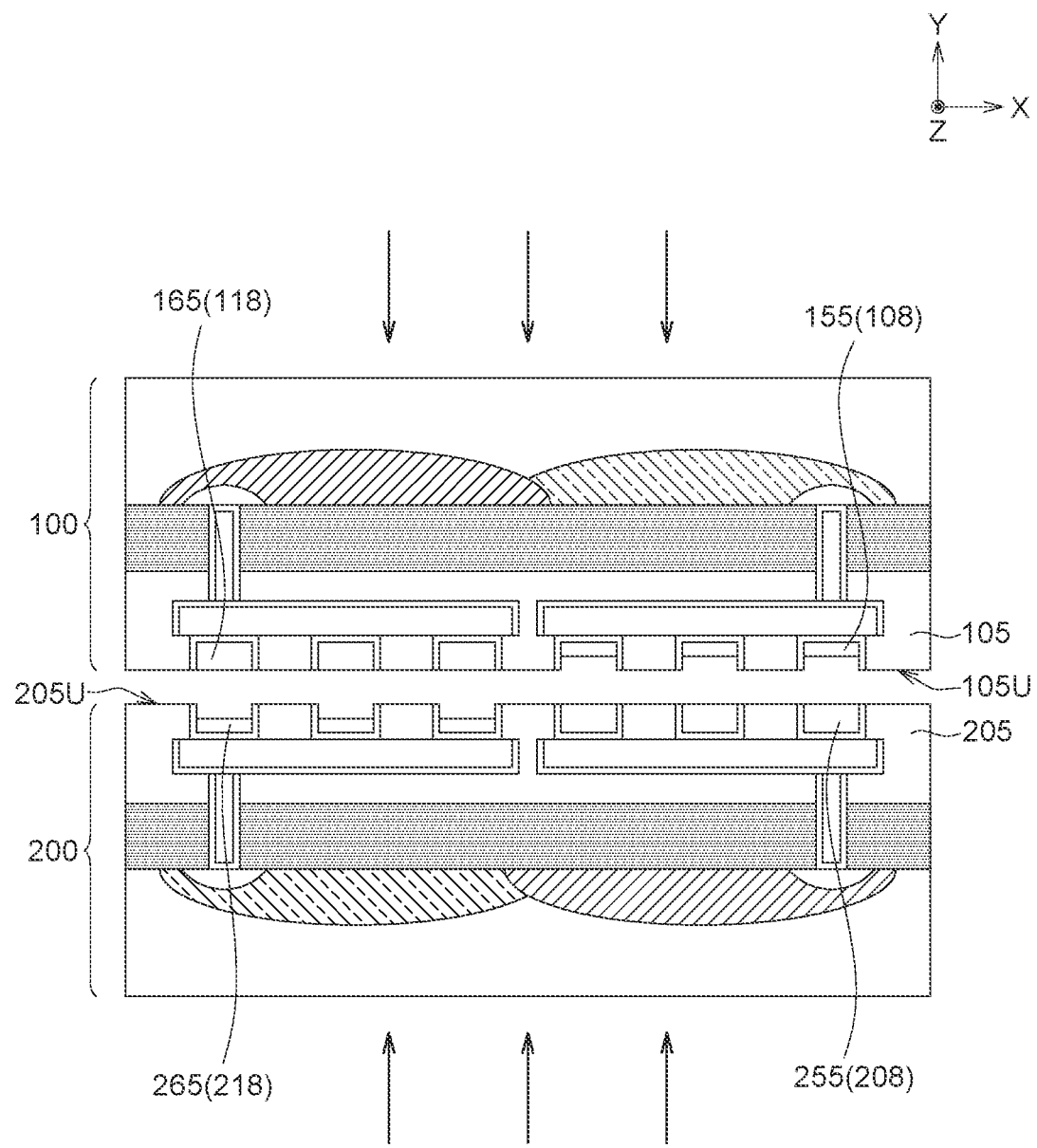

Referring to FIG. 2I, the semiconductor element 100 and the semiconductor element 200 are oriented such that the upper surface 105U of the dielectric layer 105 of the semiconductor element 100 faces the upper surface 205U of the dielectric layer 205 of the semiconductor element 200 after the formation of the semiconductor element 100 and the semiconductor element 200. A force, for example, a force in the Y direction (indicated by the arrows in FIG. 2I), is applied to the semiconductor element 100 and the semiconductor element 200 such that the second dielectric layer is bonded to the first dielectric layer. For example, the bonding of the semiconductor element 100 and the semiconductor element 200 may include bonding the upper surface 105U of the dielectric layer 105 of the semiconductor element 100 to the upper surface 205U of the dielectric layer 205 of the semiconductor element 200, bonding the via element 108 of the semiconductor element 100 to the via element 208 of the semiconductor element 200, and bonding the via element 118 of the semiconductor element 100 to the via element 218 of the semiconductor element 200. After the bonding of the semiconductor element 100 and the semiconductor element 200, an annealing process (not shown) may be performed. Through the annealing process, the conductive via 155 of the via element 108 of the semiconductor element 100 and the conductive via 255 of the via element 208 of the semiconductor element 200 may be regrown and bonded to each other and/or the conductive via 165 of the via element 118 of the semiconductor element 100 and the conductive via 265 of the via element 218 of the semiconductor element 200 may be regrown and bonded to each other. In an embodiment, a semiconductor assembly 10 may be provided through the method schematically illustrated in FIGS. 2A-2I.

In a comparative example, the semiconductor assembly and the method for manufacturing the same do not include a well in the substrate, but use a chemical-mechanical planarization process to make the upper surface of the conductive via lower than the upper surface of the dielectric layer to meet the requirements of hybrid bonding. However, a rounding corner or a sloping edge is usually formed at the connection between the dielectric layer and the barrier layer and the upper surface of the barrier layer may be sloped, which results in a decrease in the bonding surface area and a degradation of the bonding quality.

According to the embodiments described above, the semiconductor assembly and the method for manufacturing the same provided by the present disclosure include arranging corresponding wells having different doping types (e.g. well 102 and well 202) in a pair of semiconductor elements (e.g. semiconductor element 100 and semiconductor element 200) to be bonded. The well in the substrate can control the height of the upper surface of the conductive via, without using a chemical-mechanical planarization process to make the upper surface of the conductive via lower than the upper surface of the dielectric layer. As such, the problems of rounding corner or sloping edge at the connection between the dielectric layer and the barrier layer and/or sloped upper surface of the barrier layer caused by the chemical-mechanical planarization process can be prevented, a sufficient bonding surface area can be ensured, the bonding quality can be improved effectively, and the bonding failure risk is reduced.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor assembly, comprising:
a first substrate;
a first well in the first substrate and having a first doping type;
a second substrate;
a second well in the second substrate and having a second doping type different from the first doping type;
a first dielectric layer between the first substrate and the second substrate;
a second dielectric layer between the first substrate and the second substrate;
a third well in the first substrate and having the second doping type; and
a fourth well in the second substrate and having the first doping type,
wherein the second dielectric layer is bonded to the first dielectric layer, the first well overlaps with the second well in a longitudinal direction, and the third well overlaps with the fourth well in the longitudinal direction.

2. The semiconductor assembly according to claim 1, further comprising a first via element in the first dielectric layer and a second via element in the second dielectric layer, wherein the first via element is bonded to the second via element, the first well, the second well, the first via element and the second via element are electrically connected to each other.

3. The semiconductor assembly according to claim 2, further comprising:
a first doping region in the first well and having the first doping type; and
a second doping region in the second well and having the second doping type,
wherein the first via element is electrically connected to the first doping region in the first well, the second via element is electrically connected to the second doping region in the second well.

4. The semiconductor assembly according to claim 2, further comprising a first conductive region in the first dielectric layer and between the first via element and the first substrate.

5. The semiconductor assembly according to claim 2, further comprising a second conductive region in the second dielectric layer and between the second via element and the second substrate, wherein an area of the second conductive region is larger than an area of the second via element.

6. The semiconductor assembly according to claim 1, wherein the third well adjoins the first well, the fourth well adjoins the second well.

7. The semiconductor assembly according to claim 1, further comprising:
a third doping region in the third well and having the second doping type; and
a fourth doping region in the fourth well and having the first doping type.

8. The semiconductor assembly according to claim 7, further comprising a third via element and a fourth via element, wherein the third via element is in the first dielectric layer and electrically connected to the third doping region in the third well, the fourth via element is in the second dielectric layer and electrically connected to the fourth doping region in the fourth well, the third via element is bonded to the fourth via element.

9. The semiconductor assembly according to claim 8, further comprising a third conductive region in the first dielectric layer and between the third via element and the first substrate, the third via element, the third conductive region and the third doping region in the third well are electrically connected to each other.

* * * * *